United States Patent [19]
Streit et al.

[11] Patent Number: 6,078,065
[45] Date of Patent: Jun. 20, 2000

[54] BILATERALLY CONTROLLABLE THYRISTOR

[75] Inventors: Peter Streit, Widen; Kenneth Thomas, Schaffhausen, both of Switzerland

[73] Assignee: Asea Brown Boveri AG, Baden, Switzerland

[21] Appl. No.: 09/046,522

[22] Filed: Mar. 24, 1998

[30] Foreign Application Priority Data

May 22, 1997 [DE] Germany ............................ 197 21 365

[51] Int. Cl.⁷ .................................................. H01L 29/747
[52] U.S. Cl. ......................... 257/126; 257/127; 257/119; 257/128; 257/144; 257/170
[58] Field of Search .................................... 257/126, 127, 257/119, 170, 128, 144

[56] References Cited

U.S. PATENT DOCUMENTS

| 3,792,320 | 2/1974 | Hutson | 257/163 |
| 4,641,175 | 2/1987 | Shiraishi | 257/163 |

FOREIGN PATENT DOCUMENTS

| 26 48 159 | 4/1978 | Germany . | |
| 44 39 012 A1 | 5/1996 | Germany . | |
| 57-49269 | 3/1982 | Japan | 257/119 |

OTHER PUBLICATIONS

Bi–Directional Control Thyristor Production Information; ABB Semiconductors AG; Bjorn Backlund et al.; Jan., 1997; pp. 1–19.

Primary Examiner—Jerome Jackson, Jr.
Attorney, Agent, or Firm—Oblon, Spivak, McClelland, Maier & Neustadt, P.C.

[57] ABSTRACT

A specification is given of a bidirectionally controllable thyristor which is distinguished by improved decoupling between the two thyristor structures. In particular, the intention is that the switched-off structure cannot be triggered in an uncontrolled manner by undesirable migration of charge carriers. This is achieved by virtue of the fact that the degree of shorting of the cathode region increases toward the isolation region. In particular, this can be achieved by virtue of the fact that the density per unit area of the short-circuit regions tends to a maximum value toward the isolation region. The use of a linear, continuous short-circuit region running along the isolation region is particularly favorable. (FIG. 1).

20 Claims, 4 Drawing Sheets

BILATERALLY CONTROLLABLE THYRISTOR

BACKGROUND OF THE INVENTION

1. Field of the Invention

The invention is concerned with the field of power semiconductor components and relates to a bilaterally controllable thyristor according to the preamble of the first claim.

2. Discussion of Background

A thyristor of the generic type is described for example in German Patent Application DE 44 39 012 A1. That document concerns a bilaterally controllable thyristor in which two reverse-connected parallel thyristor structures are integrated in a semiconductor substrate. The thyristor structures are decoupled on the component surfaces by a respective isolation region with a carrier lifetime that is preferably reduced. An isolation region between the thyristor structures is principally necessary for two reasons: firstly, in the event of one thyristor structure being triggered, no parasitic current paths to the other thyristor structure should be produced; also, no interaction between the two thyristor structures should occur during commutation. Although the solution according to the prior art may already be sufficient in many cases, undesirable migration of charge carriers from one thyristor structure that has already triggered to the other thyristor structure that has not yet triggered means that the switched-off thyristor structure can be destroyed by local, uncontrollable triggering.

SUMMARY OF THE INVENTION

Accordingly, one object of the invention is to provide a novel bilaterally controllable thyristor which is distinguished by improved decoupling between the two thyristor structures. In particular, the intention is that the switched-off structure cannot be triggered in an uncontrolled manner by undesirable migration of charge carriers. This object is achieved by means of the features of the independent claims.

The heart of the invention is that the degree of shorting of the cathode region increases toward the isolation region. This can be achieved by virtue of the fact that the density per unit area of the shortcircuit regions tends to a maximum value toward the isolation region. Moreover, the use of a linear, continuous short-circuit region running along the isolation region is particularly favorable.

In a preferred exemplary embodiment, further improved decoupling of the two thyristor structures is achieved by an essentially horseshoe-shaped region which is arranged in the region between the central gate regions and the adjacent anode region. The horseshoe-shaped region likewise contributes to the fact that the charge carriers injected into the gatecathode circuit cannot follow a parasitic current path between the gate region and the anode region of the other thyristor structure of the same main surface. The horseshoe-shaped region is advantageously produced by etching or by masked implantation of dopants in this region.

A further improvement in the isolation between the thyristor structures of a thyristor according to the invention is also achieved by virtue of the fact that the central gate region reaches laterally into the respective cathode region and is aligned with the corresponding anode emitter. In addition, an angle which is greater than zero and, in particular, is 45° should be spanned between the isolation region and any strengthening gate finger structure. The diametrically running isolation region should have a width of approximately 10 diffusion lengths of the minority charge carriers.

Further advantageous embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
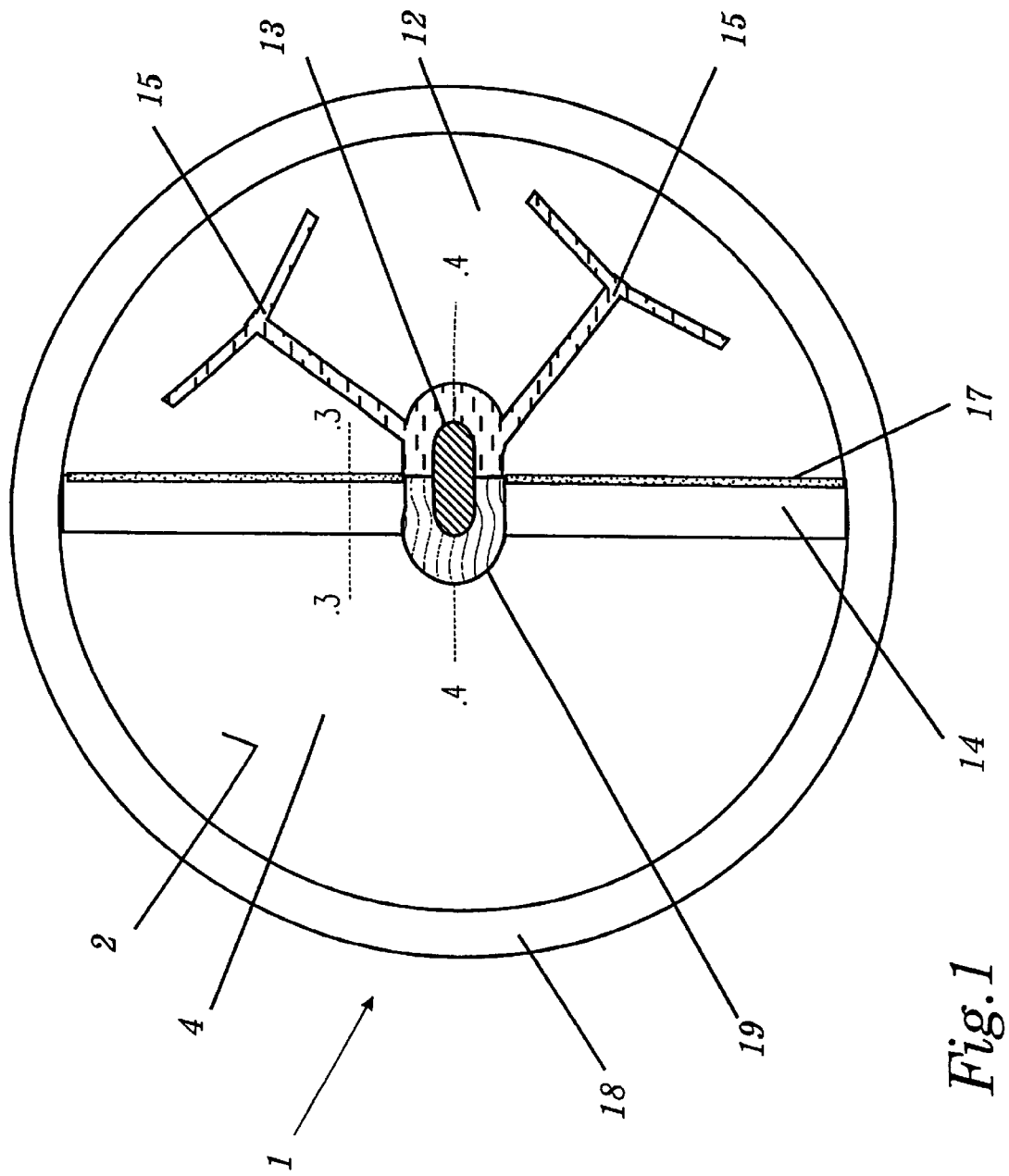
FIG. 1 shows a thyristor according to the invention from above.

The reference numerals used in the drawings and their meanings are summarized in the List of Designations.

DESCRIPTION OF THE PREFERRED EMBODIMENTS

Referring now to the drawings, wherein like reference numerals designate identical or corresponding parts throughout the several views, FIG. 1 shows a thyristor 1 according to the invention from above. In a semiconductor body two thyristor structures are arranged between a first, top main surface 2 and a second bottom main surface 3 (visible in FIG. 2). The anode region 4 of the first thyristor structure, the cathode region 12 of the second thyristor structure, the central gate region 13 of the second thyristor structure, an edge termination region 18 and a strengthening gate finger structure 15 are visible from above. An isolation region 14 is provided between the thyristor structures. This isolation region 14 is horseshoe-shaped in a region surrounding the central gate 13 and is designed such that it has a particularly high impedance. Short-circuit regions 16 (only visible in the sectional views) are provided in the region of the second cathode region 12. In order to avoid undesirable migration of charge carriers from one thyristor structure that has already triggered to the other thyristor structure that has not triggered—this might bring about uncontrolled triggering of the thyristor structure that has not yet triggered—, the density of the short-circuit regions 16 increases toward the isolation region 14. At the boundary with the isolation region 14, said density reaches a maximum value, which is advantageously formed by a linear short-circuit region 17 running along the isolation region 14.

Figure 2:
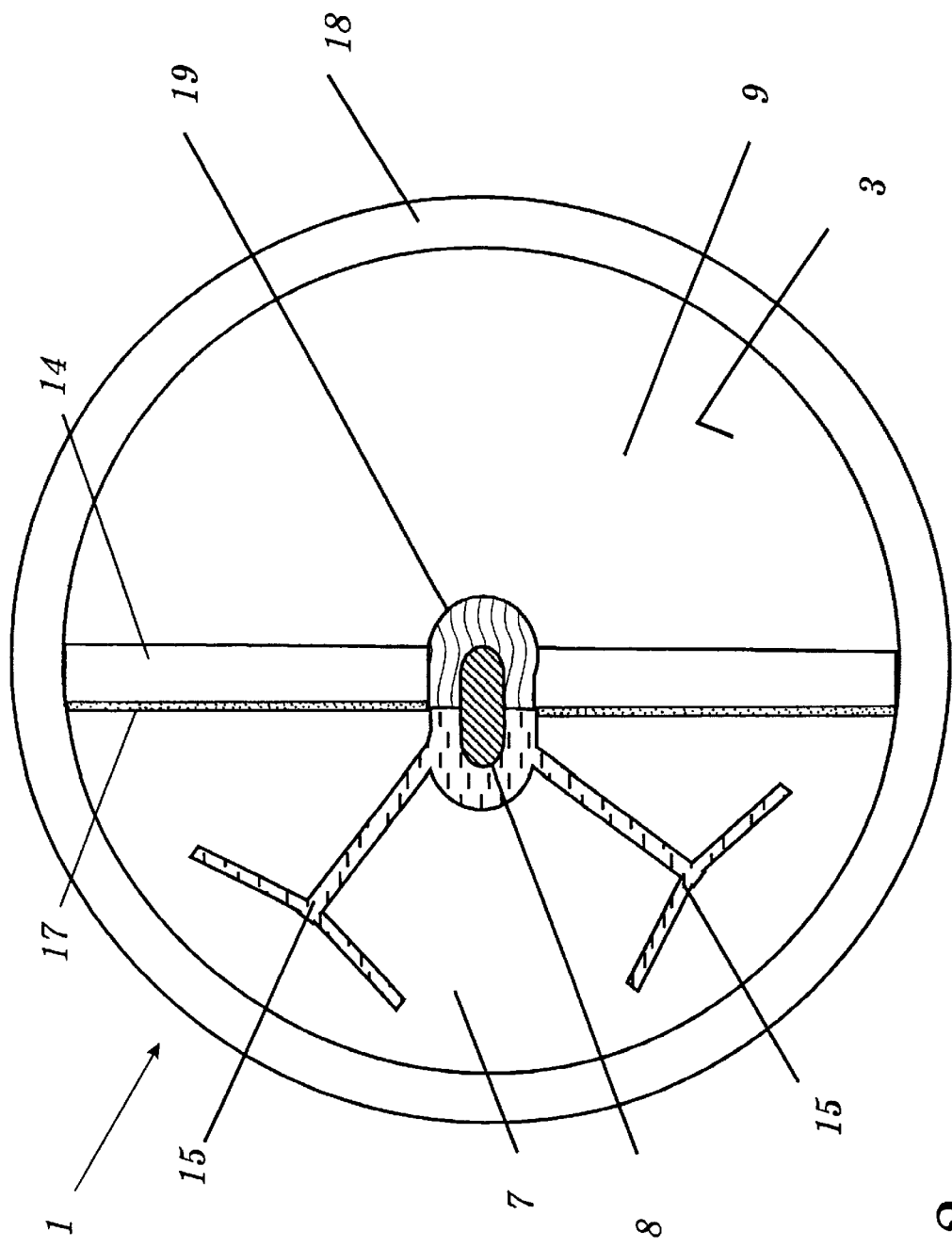
FIG. 2 shows a thyristor according to the invention from underneath.

FIG. 2 shows the thyristor from underneath. The anode region 9 of the second thyristor structure, the cathode region 7 of the first thyristor structure, the central gate region 8 of the second thyristor structure, an edge termination region 18 and a strengthening gate finger structure 15 are visible on the second main surface 3. An isolation region 14 is likewise provided between the thyristor structures. This isolation region is likewise horseshoe-shaped around the central gate 8 and is designed such that it has a particularly high impedance. Short-circuit regions 16 (only visible in the sectional views) are likewise provided in the cathode region 7. In order to avoid undesirable migration of charge carriers from one thyristor structure that has already triggered to the other thyristor structure that has not triggered—this might bring about uncontrolled triggering of the thyristor structure that has not yet triggered—, the density of the short-circuit regions 16 increases toward the isolation region 14 in this case, too. At the boundary with the isolation region 14, said density reaches a maximum value, which is likewise advantageously formed by a linear short-circuit region 17 running along the isolation region 14. The isolation region 14 runs diametrically on both main surfaces 2 and 3 and has a width of approximately 10 diffusion lengths of the minority charge carriers.

FIGS. 1 and 2 additionally show the strengthening gate finger structure 15. In contrast to the prior art cited in the introduction, this strengthening gate finger structure 15 has no part which runs along the isolation region 14; rather an angle which is at least greater than zero and, preferably, is 45° is spanned between the isolation region 14 and the fingers 15 of the strengthening gate finger structure. As a result, the finger structure 15 ensures an efficient triggering reaction, on the one hand, but, on the other hand, prevents undesirable triggering in the region between the two thyristor structures.

Figure 3:
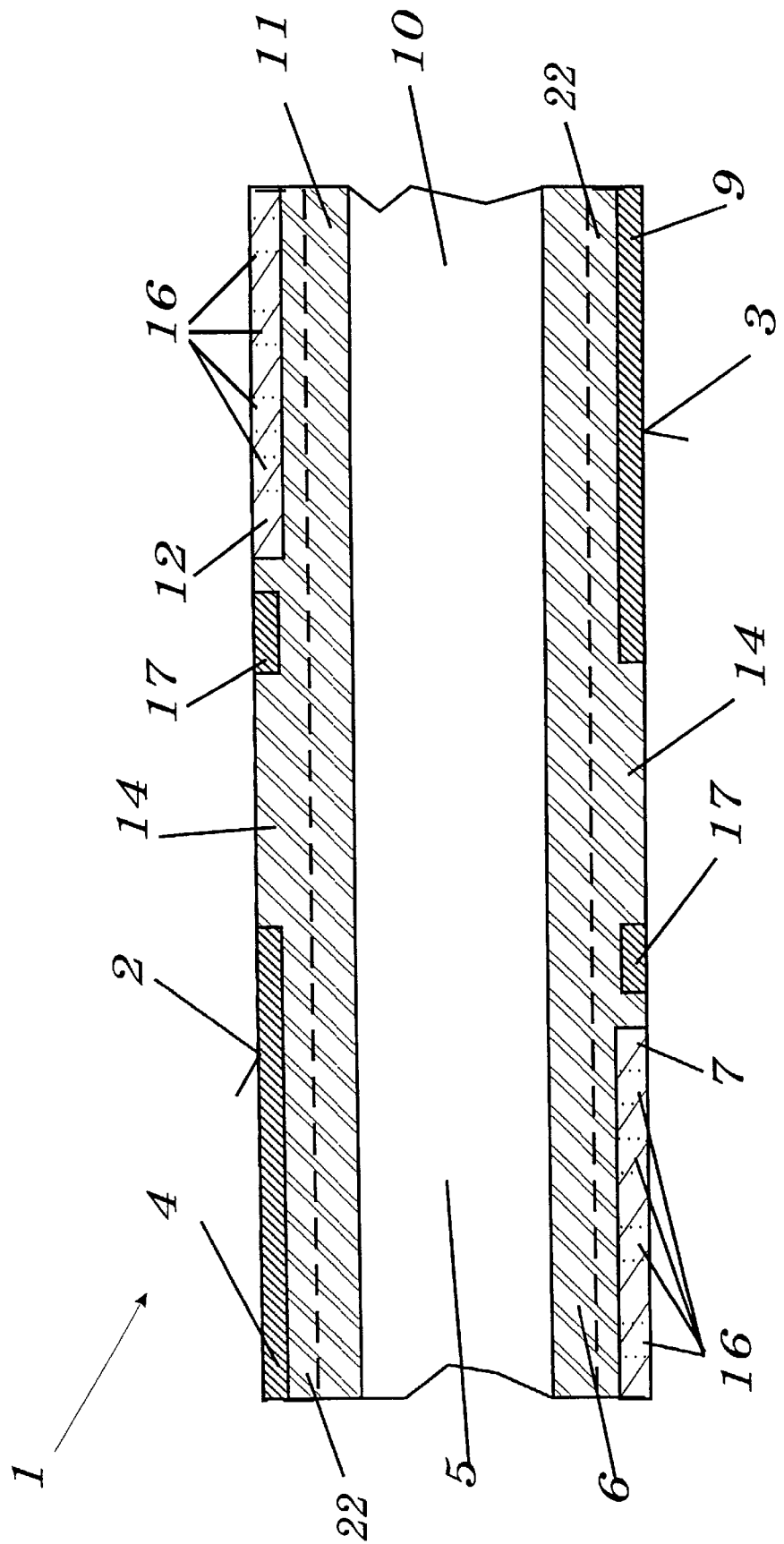
FIG. 3 shows a thyristor according to the invention in section along the line A—A of FIG. 1.

FIG. 3 shows a detail of a thyristor according to the invention along the line A—A in section. The way in which a short-circuit region 17 is arranged along the isolation region 14 on both main surfaces 2 and 3 is clearly discernable. For reasons of production, the short-circuit region 17 may, as illustrated, be slightly spaced apart from the adjacent cathode region 12 or 7. The area density, that is to say the number of short-circuit regions 16 per unit area increases within the corresponding cathode region 7 or 12 toward the continuous, linear short-circuit region 17. The short-circuit regions 16 and the short-circuit region 17 short circuit the first and second p-type bases 6, 11 through the first and second cathode regions 7, 12, respectively, with a metallization layer which covers the cathode region and is not illustrated for the sake of clarity. The higher density of short-circuit regions 16 toward the isolation region and also, in particular, the continuous, linear short-circuit region 17 ensure that during turn-off, charge carriers are depleted sufficiently rapidly and an uncontrolled triggering leading to destruction can be avoided. Consequently, any charge carriers flow away not via the cathode region but via the short circuits. As a result, they do not cause any uncontrolled triggering either.

Moreover, the p-type bases 6 and 11 are dimensioned as continuous layers into which more highly doped anode emitter regions 4, 9 are diffused. On both sides, the isolation regions 14 are formed by surfacing parts of the p-type bases.

FIGS. 1 and 2 additionally reveal the horseshoe-shaped region 19 of the isolation region 14 which surrounds the central gate region 8, 13. The opening of the horseshoe faces the first and the second cathode region. The region 19 reinforces the isolation effect between the two thyristor structures and prevents the charge carriers injected into the gate-cathode circuit from being able to follow a parasitic current path between gate contact and the anode region of the other thyristor structure of the same main surface. The higher impedance can be achieved by etching an existing doping profile or by selective masked implantation of suitable dopants in the region of the region 19.

The shape of the central gate regions 8 and 13 is elongate and stretched into the cathode regions 7 and 12. That end of the central gate regions 8 and 13 which is situated nearest the respective cathode region is arranged exactly above the anode regions 4 and 9 of the same thyristor structure. This exact alignment likewise contributes to improved decoupling of the two thyristor structures and ensures, in particular, reproducible component properties.

Figure 4:
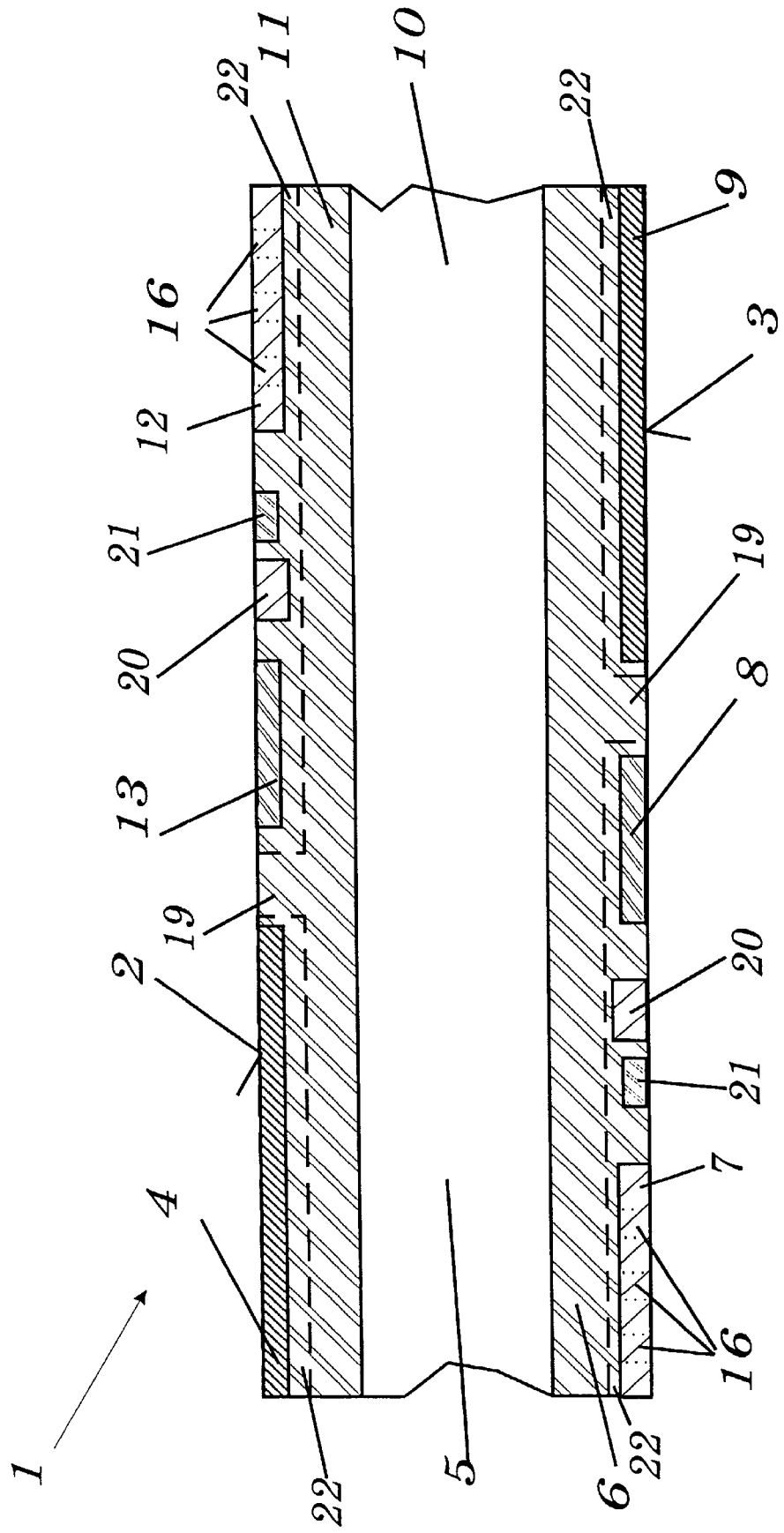
FIG. 4 shows a thyristor according to the invention in section along the line B—B of FIG. 1.

FIG. 4 shows a section along the line B—B of FIG. 1. The way in which the p-type base surfaces between the central gate regions 13 and 8 and the adjacent anode regions 4 and 9 and forms the horseshoe-shaped isolation region 19 can be clearly seen. This isolation region is designed such that it has a particularly high impedance by omitting in this region an additional doping 22 which essentially determines the conductivity of the p-type bases 6 and 11 and is otherwise formed over the whole area (see FIG. 3). This can be done by etching an existing doping profile or by selective masked implantation of the p-doped layer 22 in the desired region. An n-doped auxiliary cathode 20 and a p+ doped contact region 21 are provided at that end of the central gate regions 13 and 18 which is opposite to the isolation region 19. They are then followed by the cathode region 12 with the short-circuit regions 16, whose density, as mentioned, increases toward the center of the component.

What is produced overall is a bidirectionally conducting thyristor whose decoupling between the two thyristor structures is greatly improved and can consequently be operated reliably in any operating situation.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A bilaterally controllable thyristor comprising, in a semiconductor body,
   (a) between a first main surface and a second main surface, a first thyristor structure having a first anode region, a first n-type base, a first p-type base, a first cathode region and a first central gate region and, reverse-connected in parallel therewith, a second thyristor structure having a second anode region, a second n-type base, a second p-type base, a second cathode region and a second central gate region, the first anode region, the second cathode region and the second gate region being assigned to the first main surface and the second anode region, the first cathode region and the first gate region being assigned to the second main surface;
   on both main surfaces, a respective isolation region which is arranged between the two thyristor structures between the first anode region and the second cathode region and between the second anode region and the first cathode region; as well as
   (c) short-circuit regions which short circuit the first and second p-type bases through the first and second cathode regions, respectively, with a metallization layer which covers the cathode regions;
   wherein a density per unit area of the short-circuit regions increases toward the isolation region and assumes a maximum value directly adjacent to the isolation region, and
   wherein the short-circuit regions comprise short-circuit region running along the isolation regions.

2. The thyristor as claimed in claim 1, wherein the short circuit regions running along the isolation regions are continuous and linear between the cathode regions and the isolation regions.

3. The thyristor as claimed in claim 1, wherein a region which is designed centrally in the shape of a horseshoe and, in particular, has a particularly high impedance is provided around the first and the second central gate region, between the gate regions and the adjacent anode regions, the opening of the horseshoe facing the first and the second cathode region.

4. The thyristor as claimed in claim 1, wherein each thyristor structure has a strengthening gate finger structure, which proceeds from the corresponding central gate region and is integrated in the corresponding cathode region on the first and second main surface respectively, in such a way that an angle which is greater than zero and, in particular, is approximately 45° is spanned between the isolation regions and the gate finger structures.

5. The thyristor as claimed in claim 1, wherein those edges of the central gate regions which face the cathode regions are aligned exactly with the anode region of the corresponding thyristor structure.

6. The thyristor as claimed in claim 1, wherein the isolation regions run diametrically and have a width of approximately 10 diffusion lengths of the minority charge carriers.

7. The thyristor as claimed in claim 3, wherein the horseshoe-shaped region is produced by etching.

8. The thyristor as claimed in claim 3, wherein the horseshoe-shaped region is produced by masked implantation of part of the dopants forming the p-type base.

9. The thyristor as claimed in claim 2, wherein a region which is designed centrally in the shape of a horseshoe and, in particular, has a particularly high impedance is provided around the first and the second central gate region, between the gate regions and the adjacent anode regions, the opening of the horseshoe facing the first and the second cathode region.

10. The thyristor as claimed in claim 2, wherein each thyristor structure has a strengthening gate finger structure, which proceeds from the corresponding central gate region and is integrated in the corresponding cathode region on the first and second main surface respectively, in such a way that an angle which is greater than zero and, in particular, is approximately 45° is spanned between the isolation regions and the gate finger structures.

11. The thyristor as claimed in claim 3, wherein each thyristor structure has a strengthening gate finger structure, which proceeds from the corresponding central gate region and is integrated in the corresponding cathode region on the first and second main surface respectively, in such a way that an angle which is greater than zero and, in particular, is approximately 45° is spanned between the isolation regions and the gate finger structures.

12. The thyristor as claimed in claim 2, wherein those edges of the central gate regions which face the cathode regions are aligned exactly with the anode region of the corresponding thyristor structure.

13. The thyristor as claimed in claim 3, wherein those edges of the central gate regions which face the cathode regions are aligned exactly with the anode region of the corresponding thyristor structure.

14. The thyristor as claimed in claim 4, wherein those edges of the central gate regions which face the cathode regions are aligned exactly with the anode region of the corresponding thyristor structure.

15. The thyristor as claimed in claim 2, wherein the isolation regions run diametrically and have a width of approximately 10 diffusion lengths of the minority charge carriers.

16. The thyristor as claimed in claim 3, wherein the isolation regions run diametrically and have a width of approximately 10 diffusion lengths of the minority charge carriers.

17. The thyristor as claimed in claim 4, wherein the isolation regions run diametrically and have a width of approximately 10 diffusion lengths of the minority charge carriers.

18. The thyristor as claimed in claim 5, wherein the isolation regions run diametrically and have a width of approximately 10 diffusion lengths of the minority charge carriers.

19. The thyristor as claimed in claim 4, wherein the horseshoe-shaped region is produced by etching.

20. The thyristor as claimed in claim 5, wherein the horseshoe-shaped region is produced by etching.

* * * * *